(12) United States Patent
Lee et al.

(10) Patent No.: US 10,680,141 B1
(45) Date of Patent: Jun. 9, 2020

(54) LIGHT-EMITTING DIODE (LED) SWITCHING SYSTEM

(71) Applicant: Dell Products L.P., Round Rock, TX (US)

(72) Inventors: Kyung Eun Lee, Singapore (SG); Yong Gu Kang, Singapore (SG)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/430,693

(22) Filed: Jun. 4, 2019

(51) Int. Cl.
*H05B 39/04* (2006.01)
*H01L 33/50* (2010.01)
*H05B 33/08* (2020.01)
*H05B 45/00* (2020.01)

(52) U.S. Cl.
CPC ......... *H01L 33/50* (2013.01); *H05B 33/0806* (2013.01); *H05B 45/00* (2020.01)

(58) Field of Classification Search
CPC .. H01L 33/50; H05B 33/0842; H05B 33/0806
USPC .......................................................... 315/291
See application file for complete search history.

(56) References Cited

U.S. PATENT DOCUMENTS

| | | | | |
|---|---|---|---|---|
| 5,758,644 | A * | 6/1998 | Diab | ................. A61B 5/14552 356/41 |
| 2007/0051883 | A1* | 3/2007 | Rains, Jr. | ................. F21S 2/00 250/228 |
| 2010/0189429 | A1* | 7/2010 | Butterworth | ............. G03B 7/08 396/155 |
| 2013/0141013 | A1* | 6/2013 | Kodama | ............ H05B 33/0857 315/294 |
| 2014/0232289 | A1* | 8/2014 | Brandes | ............... H05B 33/083 315/250 |
| 2015/0188631 | A1* | 7/2015 | Harbers | ............. H05B 33/0803 398/119 |
| 2016/0231494 | A1* | 8/2016 | Feingold | ................ A61B 1/045 |
| 2019/0191515 | A1* | 6/2019 | Qiu | ...................... H05B 33/086 |
| 2019/0281680 | A1* | 9/2019 | Thorne | ............. H05B 33/0857 |

* cited by examiner

*Primary Examiner* — Don P Le
(74) *Attorney, Agent, or Firm* — Baker Botts L.L.P.

(57) ABSTRACT

A LED switching system, including a multi-chip LED including first and second sets of LED chips, the first set of LED chips associated with a first wavelength band and the second set of LED chips associated with a second wavelength band; a first LED driver in communication with the first set of LED chips; a second LED driver in communication with the second set of LED chips; a LED controller configured to: receive input indicating a selection of one of the wavelength bands; identifying one of the first set and the second set of LED chips associated with the selected wavelength band; and providing a signal to one of the first and the second LED drivers that is in communication with the identified set of LED chips; wherein, in response to the signal, the one of the first and the second LED drivers activates the identified set of LED chips.

15 Claims, 5 Drawing Sheets

LIGHT-EMITTING DIODE (LED) SWITCHING SYSTEM

BACKGROUND

Field of the Disclosure

The disclosure relates generally to information handling systems, and in particular, a light-emitting diode switching system of information handling systems.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

To decrease low blue light that is often output by a display device of an information handling system, a special filter and/or F/W mode (premier mode) can be employed. However, a special filter can be inconvenient and expensive, and the F/W mode can lead to a yellow and/or dark display of the display device.

SUMMARY

Innovative aspects of the subject matter described in this specification may be embodied in a light-emitting diode (LED) switching system, including a multi-chip LED including a first set of LED chips and a second set of LED chips, the first set of LED chips associated with a first wavelength band and the second set of LED chips associated with a second wavelength band, the first wavelength band differing from the second wavelength band; a first LED driver in communication with the first set of LED chips; a second LED driver in communication with the second set of LED chips; a LED controller configured to: receive input indicating a selection of one of the first and the second wavelength bands; in response to the input, identifying one of the first set and the second set of LED chips associated with the selected wavelength band; and providing a signal to one of the first and the second LED drivers that is in communication with the identified set of LED chips; wherein, in response to the signal, the one of the first and the second LED drivers activates the identified set of LED chips.

Other embodiments of these aspects include corresponding methods and apparatus.

These and other embodiments may each optionally include one or more of the following features. For instance, the first wavelength band includes wavelength peaks less than 450 nanometers, and wherein identifying one of the first set and the second set of LED chips associated with the selected wavelength band includes identifying the first set of LED chips associated with wavelength peaks less than 450 nanometers. The second wavelength band includes wavelength peaks greater (longer) than 460 nanometers, and wherein identifying one of the first set and the second set of LED chips associated with the selected wavelength band includes identifying the second set of LED chips associated with wavelength peaks greater (longer) than 460 nanometers. The first wavelength band includes wavelength peaks less than 450 nanometers, and the second wavelength band includes wavelength peaks greater (longer) than 460 nanometers. Identifying the first set of LED chips associated with wavelength peaks less than 450 nanometers. Identifying the second set of LED chips associated with wavelength peaks greater (longer) than 460 nanometers. The first and the second set of chips each include one chip. The first and the second set of chips each include two chips.

Innovative aspects of the subject matter described in this specification may be embodied in a light-emitting diode (LED) switching method, including receiving, at a LED controller, input indicating a selection of a wavelength band of a first and a second wavelength band, the first wavelength band differing from the second wavelength band; identifying, by the LED controller, one of a first set and a second set of LED chips associated with the selected wavelength band, wherein the first and the second set of LED chips are included by a multi-chip LED, the first set of LED chips associated with the first wavelength band and the second set of LED chips associated with the second wavelength band; and providing, by the LED controller, a signal to one of a first and a second LED driver that is communication with the identified set of LED chips, wherein the first LED driver is in communication with the first set of LED chips and the second LED driver is in communication with the second set of LED chips, wherein, in response to the signal, the one of the first and the second LED drivers activates the identified set of LED chips.

Other embodiments of these aspects include corresponding systems and apparatus.

These and other embodiments may each optionally include one or more of the following features. For instance, the first wavelength band includes wavelength peaks less than 450 nanometers, and wherein identifying one of the first set and the second set of LED chips associated with the selected wavelength band includes identifying the first set of LED chips associated with wavelength peaks less than 450 nanometers. The second wavelength band includes wavelength peaks greater (longer) than 460 nanometers, and wherein identifying one of the first set and the second set of LED chips associated with the selected wavelength band includes identifying the second set of LED chips associated with wavelength peaks greater (longer) than 460 nanometers. The first wavelength band includes wavelength peaks less than 450 nanometers, and the second wavelength band includes wavelength peaks greater (longer) than 460 nanometers. Identifying the first set of LED chips associated with wavelength peaks less than 450 nanometers. Identifying the second set of LED chips associated with wavelength peaks greater (longer) than 460 nanometers.

Innovative aspects of the subject matter described in this specification may be embodied in a light-emitting diode (LED) switching system, including a first multi-chip LED including a first set of LED chips and a second set of LED chips, the first set of LED chips associated with a first wavelength band and the second set of LED chips associated with a second wavelength band, the first wavelength band differing from the second wavelength band; a second multi-chip LED including a third set of LED chips and a fourth set of LED chips, the third set of LED chips associated with the second wavelength band and the fourth set of LED chips associated with the first wavelength band; a first LED driver in communication with the first set and the fourth set of LED chips; a second LED driver in communication with the second set and the third set of LED chips; a LED controller configured to: receive input indicating a selection of one of the first and the second wavelength bands; in response to the input, identifying one of i) the first and fourth sets of LED chips and ii) the second and third sets of LED chips, the identified sets of LED chips associated with the selected wavelength band; and providing a signal to one of the first and the second LED drivers that is in communication with the identified sets of LED chips; wherein, in response to the signal, the one of the first and the second LED drivers activates the identified sets of LED chips.

Other embodiments of these aspects include corresponding methods and apparatus.

These and other embodiments may each optionally include one or more of the following features. For instance, the first wavelength band includes wavelength peaks less than 450 nanometers, and wherein identifying one of i) the first and fourth sets of LED chips and ii) the second and third sets of LED chips includes identifying the first and fourth sets of LED chips associated with wavelength peaks less than 450 nanometers. The second wavelength band includes wavelength peaks greater (longer) than 460 nanometers, and wherein identifying one of i) the first and fourth sets of LED chips and ii) the second and third sets of LED chips includes identifying the second and third sets of LED chips associated with wavelength peaks greater (longer) than 460 nanometers. The first wavelength band includes wavelength peaks less than 450 nanometers, and the second wavelength band includes wavelength peaks greater (longer) than 460 nanometers. Identifying the first and fourth sets of LED chips associated with wavelength peaks less than 450 nanometers. Identifying the second and third sets of LED chips associated with wavelength peaks greater (longer) than 460 nanometers.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

This document describes a method and system for switching between low blue light and a high color gamut of a display by using a multi-chip LED solution. Specifically, different wavelengths can be applied in a same LED by selectively activating low blue light or high color gamut. This can provide either high color performance or a healthy eye mode that is chosen by the user.

Specifically, this document describes a LED switching system that includes multi-chip LED including a first set of LED chips and a second set of LED chips, the first set of LED chips associated with a first wavelength band and the second set of LED chips associated with a second wavelength band, the first wavelength band differing from the second wavelength band; a first LED driver in communication with the first set of LED chips; a second LED driver in communication with the second set of LED chips; a LED controller configured to: receive input indicating a selection of one of the first and the second wavelength bands; in response to the input, identifying one of the first set and the second set of LED chips associated with the selected wavelength band; and providing a signal to one of the first and the second LED drivers that is in communication with the identified set of LED chips; wherein, in response to the signal, the one of the first and the second LED drivers activates the identified set of LED chips.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-4 wherein like numbers are used to indicate like and corresponding parts.

Figure 1:
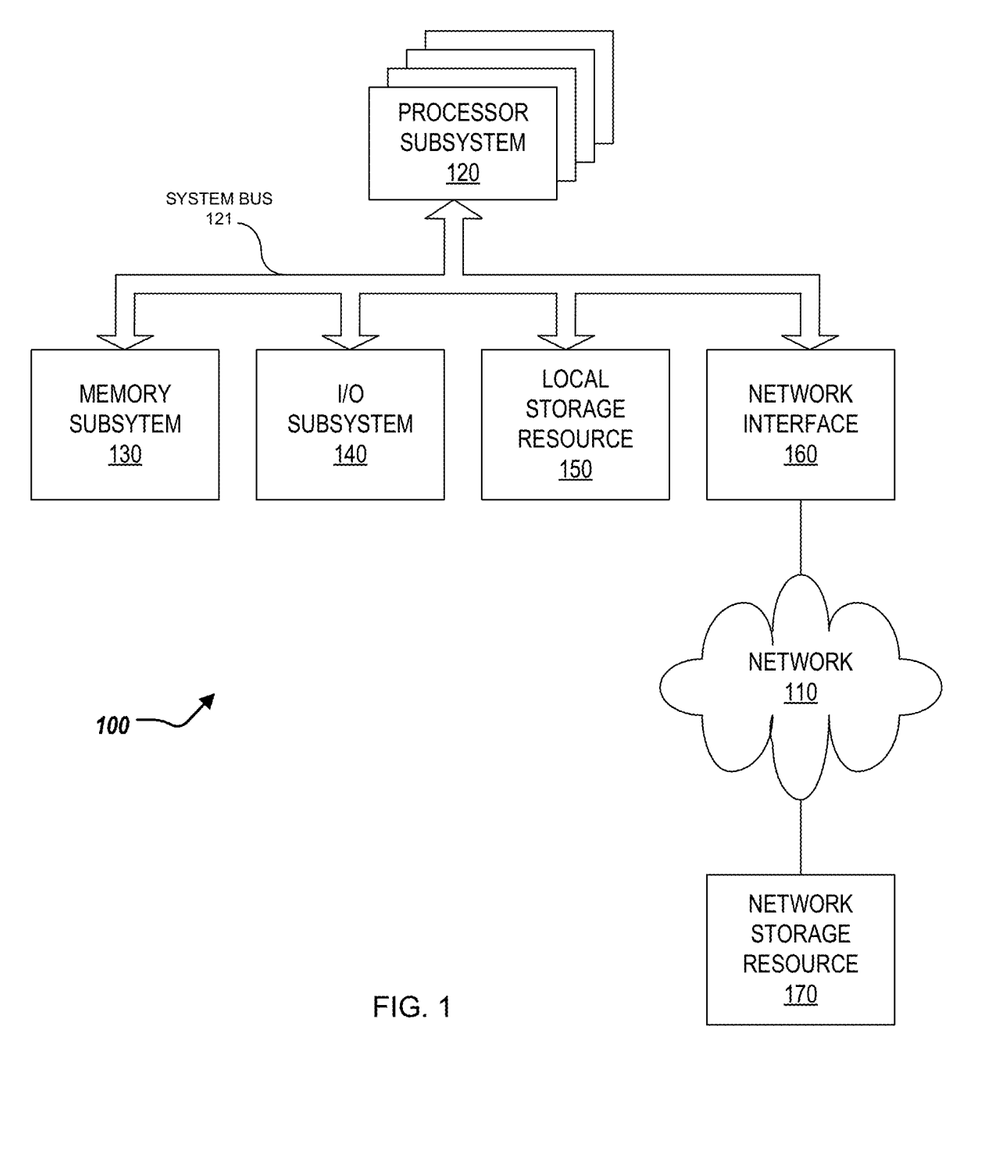
FIG. 1 is a block diagram of selected elements of an embodiment of an information handling system.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

Figure 2:
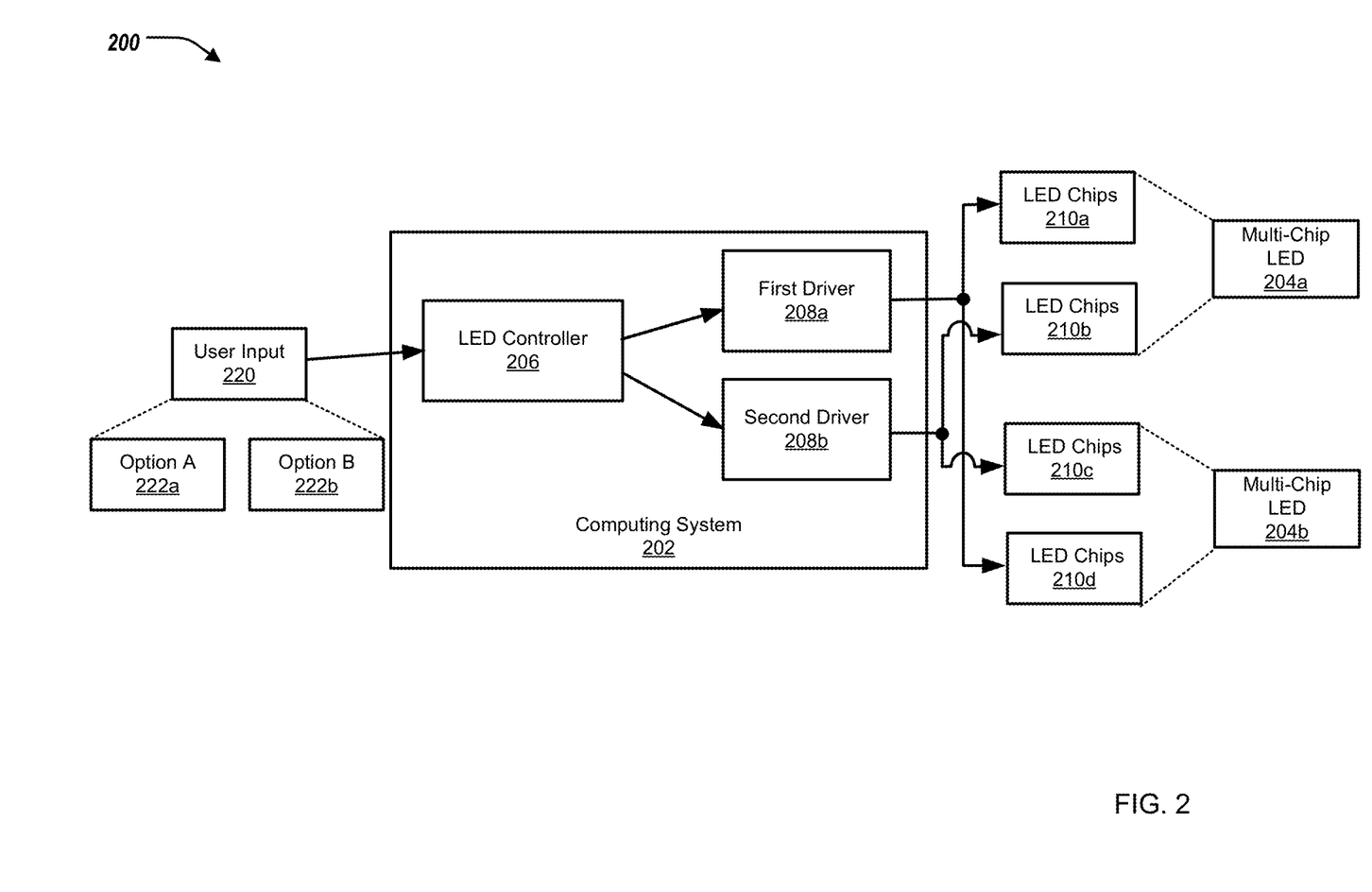
FIGS. 2 and 5 illustrates an information handling system including an LED controller for a LED switching system.

Turning now to FIG. 2, FIG. 2 illustrates a light-emitting diode (LED) switching system 200. The switching system 200 can include a computing system 202 and multi-chip LEDs 204a, 204b (collectively referred to as multi-chip LEDs 204). The computing system 202 can be similar to the information handling system 100 of FIG. 1. The computing system 202 can include a LED controller module 206, a first driver 208a, and a second diver 208b (collectively referred to as drivers 208). The multi-chip LED 204a can include a first set of LED chips 210a and a second set of LED chips 210b; and the multi-chip LED 204b can include a third set of LED chips 210c and a fourth set of LED chips 210d. The LED chips 210a, 210b, 210c, 210d can collectively be referred to as LED chips 210. The switching system 200 can include any number of multi-chip LEDs 204, and each of the multi-chip LEDs 204 can include any number of LED chips 210, depending on the application desired. In some examples, the multi-chip LEDs 204 can be included by a video display of the computing system 202. In some examples, the multi-chip LEDs 204 can be included by any type of video display of any type of computing system— e.g., laptop computing system, smartphone computing systems, tablet computing systems, wearable computing systems, virtual reality computing systems, and/or augmented reality computing systems.

The first set of LED chips 210a and the fourth set of LED chips 210d can be associated with a first wavelength band. That is, the first set of LED chips 210a and the fourth set of LED chips 210d can facilitate emitting wavelengths within the first wavelength band, e.g., visible light that is within the first wavelength band. In some examples, the first wavelength band includes peak wavelengths less than 450 nanometers. In some examples, the first wavelength band includes wavelengths between 420-450 nanometers. In some examples, the first wavelength band includes wavelengths between 440-450 nanometers. The first wavelength band can include two or more different wavelengths.

The second set of LED chips 210b and the third set of LED chips 210c can be associated with a second wavelength band. That is, the second set of LED chips 210b and the third set of LED chips 210c can facilitate emitting wavelengths within the second wavelength band, e.g., visible light that is within the second wavelength band. In some examples, the second wavelength band includes peak wavelengths greater (longer) than 460 nanometers. The second wavelength band can include two or more different wavelengths.

In some examples, each of the multi-chip LEDs 204 include two LED chips—e.g., the multi-chip LED 204a includes LED chips 210a, 210b and the multi-chip LED 204b includes LED chips 210c, 210d. However, in some examples, one or both of the multi-chip LEDs 204 can include one LED chip, two LED chips, four LED chips, or more. In some examples, each of the multi-chip LEDs 204 can including differing number of LED chips.

The first LED driver 208a can be in communication with the first set of LED chips 210a and the fourth set of LED chips 210d. That is, the first LED driver 208a can control activation and/or deactivation of the first set of LED chips 210a and the fourth set of LED chips 210d. Specifically, the first LED driver 208a can provide control signals to the first set of LED chips 210a and the fourth set of LED chips 210d to control activation and/or deactivation of the first set of LED chips 210a and the fourth set of LED chips 210d.

The second LED driver 208b can be in communication with the second set of LED chips 210b and the third set of LED chips 210c. That is, the second LED driver 208b can control activation and/or deactivation of the second set of LED chips 210b and the third set of LED chips 210c. Specifically, the second LED driver 208b can provide control signals to the second set of LED chips 210b and the third set of LED chips 210c to control activation and/or deactivation of the second set of LED chips 210b and the third set of LED chips 210c.

Figure 5:
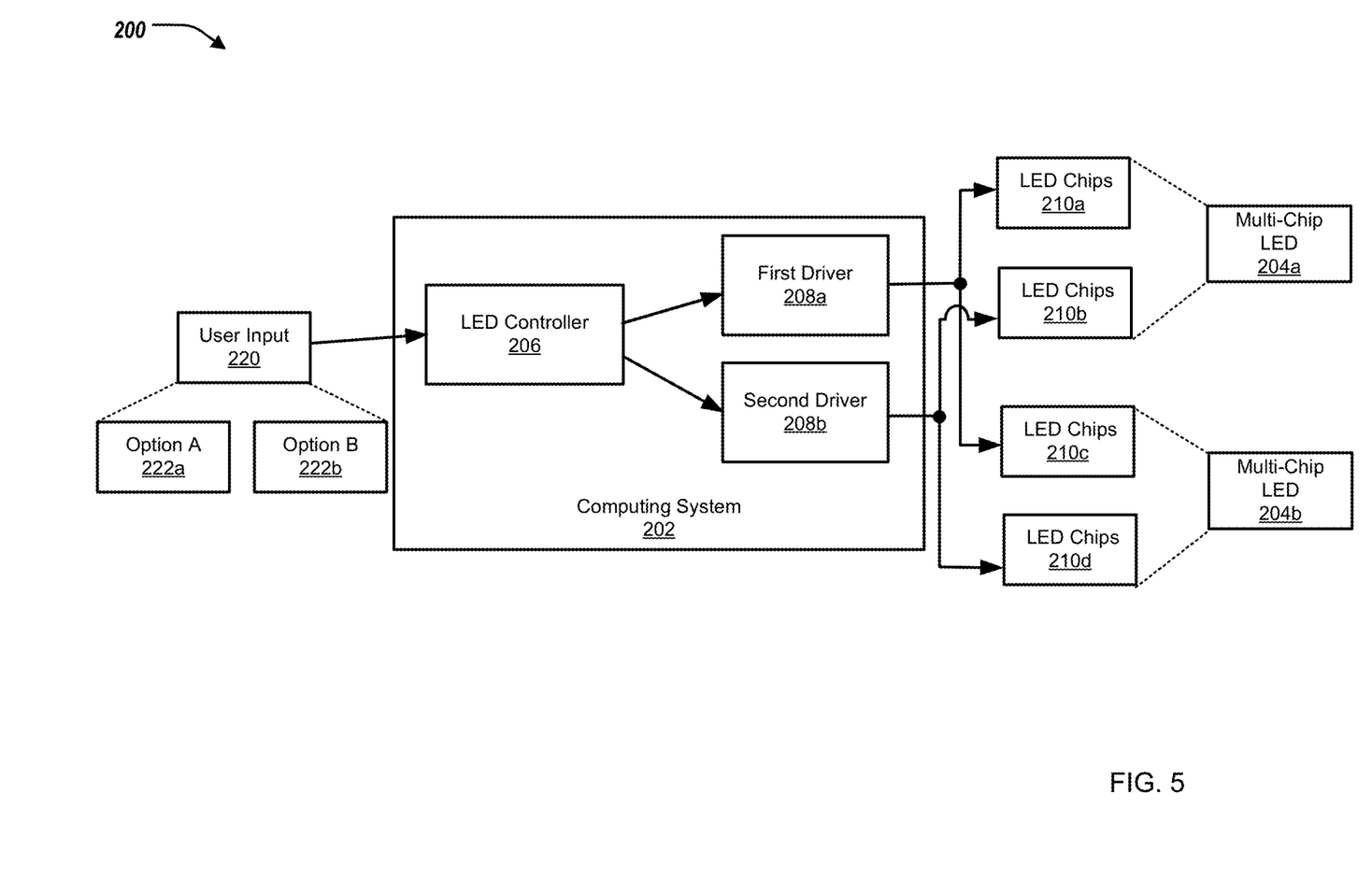

Referring to FIG. 5, in some examples, the first set of LED chips 210a and the third set of LED chips 210c can be associated with the first wavelength band; and the second set of LED chips 210b and the fourth set of LED chips 210d can be associated with the second wavelength band. Further, the first LED driver 208a can be in communication with the first set of LED chips 210a and the third set of LED chips 210c; and the second LED driver 208b can be in communication with the second set of LED chips 210b and the fourth set of LED chips 210d.

The LED controller 206 can receive user input 220. The user input 220 can indicate a selection of one of the first and the second wavelength bands. Specifically, the user input 220 can indicate a selection of option A 222a or option B 222b. Option A 222a can indicate selection of the first wavelength band. In some examples, option A 222a can indicate a high-color gamut option (high color coverage). In some examples, option A 222a can indicate a high color performance. In some examples, option A 222a can indicate a short wavelength blue chip (wavelength peaks less than 450 nanometers). Option B 222b can indicate selection of the second wavelength band. In some examples, option B 222b can indicate a low blue-light option. In some examples, option B 222b can indicate an eye protection option. In some examples, option B 222b can indicate a long wavelength blue chip (e.g., greater (longer) than 460 nanometers).

The LED controller 206, in response to receiving the user input 220, identifies one of i) first set of LED chips 210a and the fourth set of LED chips 210c and ii) the second set of LED chips 210b and the third set of LED chips 210c. Specifically, the LED controller 206 identifies one of i) the first set of LED chips 210a and the fourth set of LED chips 210d and ii) the second set of LED chips 210b and the third set of LED chips 210c, wherein the identified set of LED chips is associated with the selected wavelength band.

In some examples, in response to the user input 220 indicating option A 222a—e.g., the first wavelength band— the LED controller 206 identifies the first set of LED chips 210a and the fourth set of LED chips 210d. That is, the LED controller 206 identifies the first set of LED chips 210a and the fourth set of LED chips 210d when the user input 220 indicates the first wavelength band (e.g., wavelength peaks less than 450 nanometers). In some examples, in response to the user input 220 indicating option B 222b—e.g., the second wavelength band—the LED controller 206 identifies the second set of LED chips 210b and the third set of LED chips 210c. That is, the LED controller 206 identifies the second set of LED chips 210b and the third set of LED chips 210c when the user input 220 indicates the second wavelength band (e.g., wavelengths greater (longer) than 460 nanometers).

The LED controller 206 can provide a signal to one of the first LED driver 208a and the second LED driver 208b that is in communication with the identified sets of LED chips. That is, the LED controller 206 can provide a signal to the appropriate LED driver 208 that can control activation/deactivation of the LEDs chips 210 that the LED driver 208 is associated with. For example, when the LED controller 206 identifies the first set of LED chips 210a and the fourth set of LED chips 210d (when the user input indicates option A 222a), the LED controller 206 can provide a signal to the first LED driver 208a to activate the first set of LED chips 210a and the fourth set of LED chips 210d. In some examples, the first LED driver 208a can selectively activate the first set of LED chips 210a, the fourth set of LED chips 210d, or both. For example, when the LED controller 206 identifies the second set of LED chips 210b and the third set of LED chips 210c (when the user input indicates option B 222b), the LED controller 206 can provide a signal to the second LED driver 208b to activate the second set of LED chips 210b and the third set of LED chips 210c. In some examples, the second LED driver 208b can selectively activate the second set of LED chips 210b, the third set of LED chips 210c, or both.

One of the first LED driver 208a and the second LED driver 208b, in response to the signal from the LED controller 206, can activate the identified set of LED chips. That is, the appropriate LED driver 208 can control activation of the LED chips 210 that the LED driver 208 is associated with by sending a control signal to the appropriate LED chips 210. For example, when the LED controller 206 provides a signal to the first LED driver 208a, the first LED driver 208a can activate the first set of LED chips 210a and the fourth set of LED chips 210d (e.g., when the user input indicates option A 222a). In some examples, the first LED driver 208a can activate the first set of LED chips 210a, the fourth set of LED chips 210d, or both. For example, when the LED controller 206 provides a signal to the second LED driver 208b, the second LED driver 208b can activate the second set of LED chips 210b and the third set of LED chips 210d (e.g., when the user input indicates option B 222b). In some examples, the second LED driver 208b can activate the second set of LED chips 210b, the third set of LED chips 210c, or both.

Figure 3:
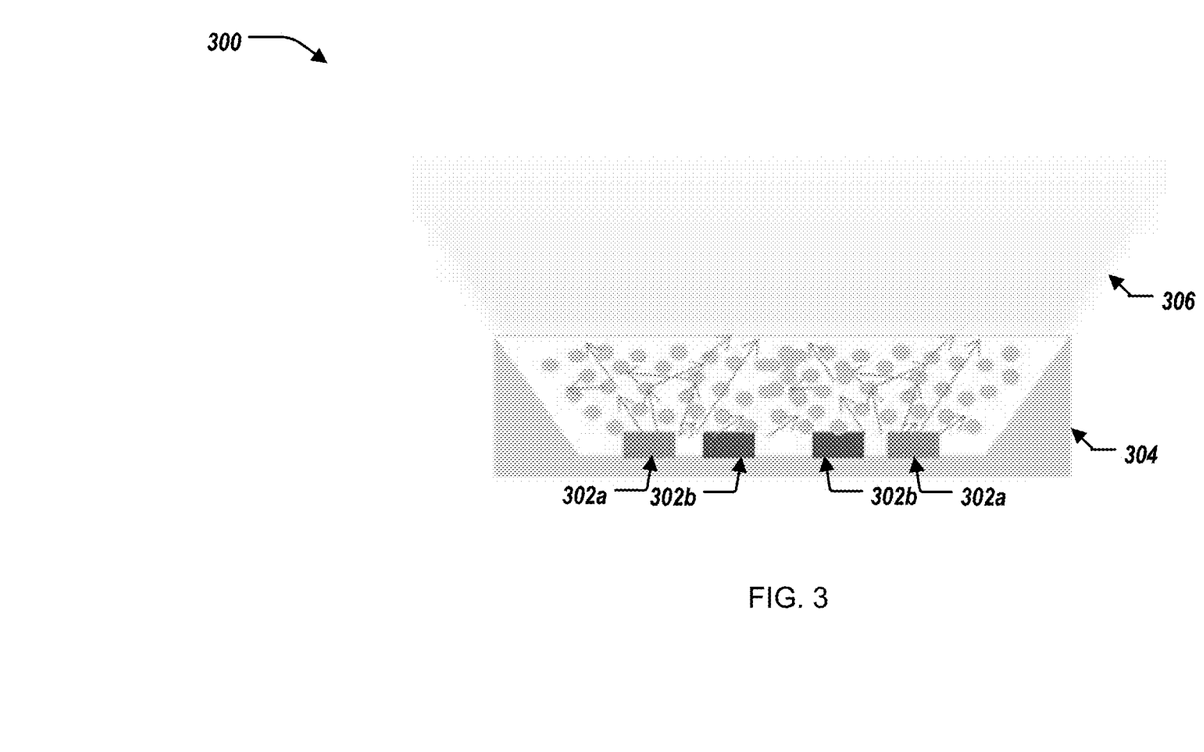
FIG. 3 illustrates a multi-chip LED.

FIG. 3 illustrates a multi-chip LED 300, similar to the multi-chip LED 204 of FIG. 2. The multi-chip LED 300 can include a first set of LED chips 302a, similar to the first set of LED chips 210a of FIG. 1, and a second set of LED chips 302b, similar to the second set of LED chips 210b of FIG. 1. The multi-chip LED 300 can further include a mold 304 that includes a gas within a cavity thereof. In some examples, the gas can include silicon with phosphor. The multi-chip LED 300 can emit a visible light 306 (e.g., a white light).

Figure 4:
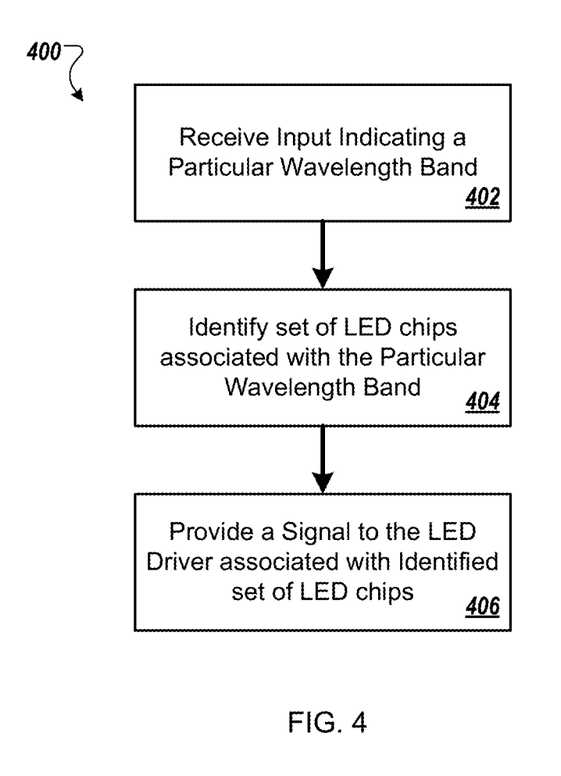
FIG. 4 illustrates a LED switching method.

FIG. 4 illustrates a flowchart depicting selected elements of an embodiment of a LED switching method 400. The method 400 may be performed by the information handling system 100, the LED switching system 200, the computing system 202, and/or the LED controller 206, described herein with reference to FIGS. 1-2, or another information handling system. It is noted that certain operations described in method 400 may be optional or may be rearranged in different embodiments.

The LED controller 206 receives input 220 indicating a selection of a wavelength band of a first and a second wavelength band (402). In some examples, the first wavelength band differs from the second wavelength band. The LED controller 206 identifies one of a first set of LED chips 210a and a second set of LED chips 210b that is associated with the selected wavelength band (404). In some examples, the first set of LED chips 210a and the second set of LED chips 210b are included by the multi-chip LED 204a. The first set of LED chips 210a are associated with the first wavelength band and the second of LED chips 210b are associated with the second wavelength band. The LED controller 206 provides a signal to one of the first LED driver 208a and the second LED driver 208b that is in communication with the identified set of LED chips 210 (406). In some examples, the first LED driver 208a is in communication with the first set of LED chips 210a and the second LED driver 208b is in communication with the second set of LED chips 210b. In some examples, one of the first LED driver 208a and the second LED driver 208b, in response to the signal, activates the identified set of LED chips 210.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A light-emitting diode (LED) switching system, comprising:
    a first multi-chip LED including a first set of LED chips and a second set of LED chips, the first set of LED chips associated with a first wavelength band and the second set of LED chips associated with a second wavelength band, the first wavelength band differing from the second wavelength band;
    a second multi-chip LED including a third set of LED chips and a fourth set of LED chips, the third set of LED chips associated with the first wavelength band and the fourth set of LED chips associated with the second wavelength band;
    a first LED driver in communication with the first set of LED chips and the third set of LED chips;

a second LED driver in communication with the second set of LED chips and the fourth set of LED chips;
a LED controller configured to:
receive input indicating a selection of the first wavelength band,
in response to the input:
i) identifying the first set and the third sets of LED chips associated with the first wavelength band, wherein the first set of LED chips and the third set of LED chips are included by differing multi-chip LEDs;
ii) providing an activation signal to the first LED driver that is in communication with the first and the third sets of LED chips to activate the first and third sets of LED chips; and
iii) providing a deactivation signal to the second LED driver that is in communication with the second and the fourth sets of LED chips to deactivate the second and the fourth sets of LED chips.

2. The LED switching system of claim 1, wherein the first wavelength band includes wavelength peaks less than 450 nanometers, and wherein identifying the first set and the third sets of LED chips associated with the first wavelength band includes identifying the first set and the third sets of LED chips associated with wavelength peaks less than 450 nanometers.

3. The LED switching system of claim 1, the LED controller further configured to:
receive additional input indicating a selection of the second wavelength band, and in response:
i) identifying the second set and the third sets of LED chips associated with the second wavelength band, wherein the second set of LED chips and the third set of LED chips are included by differing multi-LED chips;
ii) providing an activation signal to the second LED driver that is in communication with the second and the fourth set of LED chips to activate the second and the fourth set of LED chips; and
iii) providing a deactivation signal to the first LED driver that is in communication with the first and the third set of LED chips to deactivate the first and the third sets of LED chips,
wherein the second wavelength band includes wavelength peaks greater than 460 nanometers, and wherein identifying the second set and the fourth set of LED chips associated with the second wavelength band includes identifying the second set and the fourth set of LED chips associated with wavelength peaks greater than 460 nanometers.

4. The LED switching system of claim 1, wherein the first wavelength band includes wavelength peaks less than 450 nanometers, and the second wavelength band includes wavelength peaks greater than 460 nanometers.

5. The LED switching system of claim 1, wherein the first and the second multi-chip LEDs each include two chips.

6. The LED switching system of claim 1, wherein the first and the second multi-chip LEDs each include more than two chips.

7. The LED switching system of claim 4, wherein the first wavelength band includes two or more different wavelengths, and the second wavelength band includes two or more different wavelengths.

8. A light-emitting diode (LED) switching method, comprising:

identifying a first wavelength band and a second wavelength band, the first wavelength band differing from the second wavelength band;
receiving, at a LED controller, input indicating a selection of the first wavelength band;
in response to the input:
i) identifying, by the LED controller, a first set and a third set of LED chips associated with the first wavelength band, wherein the first set of LED chips are included by a first multi-chip LED and the third set of LED chips are included by a second multi-chip LED, the first multi-chip LED additionally including a second set of LED chips and the second multi-chip LED additionally including a fourth set of LED chips, the first and the third sets of LED chips associated with the first wavelength band and the second and the fourth sets of LED chips associated with the second wavelength band;
ii) providing, by the LED controller, an activation signal to a first LED driver that is in communication with the first and the third sets of LED chips to activate the first and the third sets of LED chips, wherein the first LED driver is in communication with the first and the third sets of LED chips,
iii) providing, by the LED controller, a deactivation signal to a second LED driver that is in communication with the second and the fourth sets of LED chips to deactivate the second and the fourth sets of LED chips, wherein the second LED driver is in communication with the second and the fourth sets of LED chips.

9. The method of claim 8, wherein the first wavelength band includes wavelength peaks less than 450 nanometers, and wherein identifying the first set and the third set of LED chips associated with the first wavelength band includes identifying the first and the third sets of LED chips associated with wavelength peaks less than 450 nanometers.

10. The method of claim 8, further comprising:
receiving additional input indicating a selection of the second wavelength band, and in response:
i) identifying the second set and the fourth set of LED chips associated with the second wavelength band, wherein each of the second and the fourth sets of LED chips are included by differing multi-LED chips;
ii) providing an activation signal to the second LED driver that is in communication with the second and the fourth sets of LED chips to activate the second and the fourth sets of LED chips; and
iii) providing a deactivation signal to the first LED driver that is in communication with the first and the third sets of LED chips to deactivate the first and the third sets of LED chips,
wherein the second wavelength band includes wavelength peaks greater than 460 nanometers, and wherein identifying the second set and the fourth set of LED chips associated with the second wavelength band includes identifying the second set and the fourth set of LED chips associated with wavelength peaks greater than 460 nanometers.

11. The method of claim 8, wherein the first wavelength band includes wavelength peaks less than 450 nanometers, and the second wavelength band includes wavelength peaks greater than 460 nanometers.

12. A light-emitting diode (LED) switching system, comprising:

a first multi-chip LED including a first set of LED chips and a second set of LED chips, the first set of LED chips associated with a first wavelength band and the second set of LED chips associated with a second wavelength band, the first wavelength band differing from the second wavelength band;

a second multi-chip LED including a third set of LED chips and a fourth set of LED chips, the third set of LED chips associated with the second wavelength band and the fourth set of LED chips associated with the first wavelength band;

a first LED driver in communication with the first set and the fourth set of LED chips;

a second LED driver in communication with the second set and the third set of LED chips;

a LED controller configured to:

receive input indicating a selection of the first wavelength band;

in response to the input:

i) identifying the first and fourth sets of LED chips associated with the first wavelength band, wherein the first set of LED chips and the fourth set of LED chips are included by differing multi-chip LEDs;

ii) providing an activation signal to the first LED driver that is in communication with the first and the fourth sets of LED chips to activate the first and the fourth sets of LED chips;

iii) providing a deactivation signal to the second LED driver that is in communication with the second and the third sets of LED chips to deactivate the second and the third sets of LED chips.

13. The LED switching system of claim 12, wherein the first wavelength band includes wavelength peaks less than 450 nanometers, and wherein identifying the first and fourth sets of LED chips includes identifying the first and fourth sets of LED chips associated with wavelength peaks less than 450 nanometers.

14. The LED switching system of claim 12, the LED controller further configured to:

receive additional input indicating a selection of the second wavelength band, and in response:

i) identifying the second set and the third set of LED chips associated with the second wavelength band, wherein each of the second and the third sets of LED chips are included by differing multi-LED chips;

ii) providing an activation signal to the second LED driver that is in communication with the second and the third sets of LED chips to activate the second and the third sets of LED chips; and       iii) providing a deactivation signal to the first LED driver that is in communication with the first and the fourth sets of LED chips to deactivate the first and the fourth set of LED chips, wherein the second wavelength band includes wavelength peaks greater than 460 nanometers, and wherein identifying the second and third sets of LED chips includes identifying the second and third sets of LED chips associated with wavelength peaks greater than 460 nanometers.

15. The LED switching system of claim 12, wherein the first wavelength band includes wavelength peaks less than 450 nanometers, and the second wavelength band includes wavelength peaks greater than 460 nanometers.

* * * * *